United States Patent
Yoo et al.

(10) Patent No.: US 6,784,438 B2
(45) Date of Patent: Aug. 31, 2004

(54) ELECTRON PROJECTION LITHOGRAPHY APPARATUS USING SECONDARY ELECTRONS

(75) Inventors: In-kyeong Yoo, Suwon (KR); Chang-wook Moon, Seoul (KR); Dong-wook Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/688,953

(22) Filed: Oct. 21, 2003

(65) Prior Publication Data

US 2004/0084637 A1 May 6, 2004

(30) Foreign Application Priority Data

Oct. 22, 2002 (KR) ................ 10-2002-0064548

(51) Int. Cl.[7] ............................................ H01J 37/073
(52) U.S. Cl. .................. 250/399; 250/310; 250/492.3; 250/494.1
(58) Field of Search ................. 250/399, 310, 250/492.3, 494.1

(56) References Cited

U.S. PATENT DOCUMENTS 6,476,402 B1   11/2002  Yoo ............... 250/492.24
2004/0061432 A1 * 4/2004  McClelland et al. ..... 313/497

* cited by examiner

*Primary Examiner*—Nikita Wells
(74) *Attorney, Agent, or Firm*—Lee & Sterba, P.C.

(57) ABSTRACT

An electron projection lithography apparatus using secondary electrons includes a secondary electron emitter which is spaced apart from a substrate holder by a first predetermined interval and has a patterned mask formed on a surface thereof to face the substrate holder, a primary electron emitter which is spaced apart by a second predetermined interval from the secondary electron emitter in a direction opposite to the substrate holder and emits primary electrons to the secondary electron emitter, a second power supply which applies a second predetermined voltage between the substrate holder and the secondary electron emitter, a first power supply which applies a first predetermined voltage between the secondary electron emitter and the primary electron emitter, and a magnetic field generator which controls a path of secondary electrons emitted from the secondary electron emitter.

9 Claims, 2 Drawing Sheets

ELECTRON PROJECTION LITHOGRAPHY APPARATUS USING SECONDARY ELECTRONS

BACKGROUND OF THE INVENTION

1. Field of the Invention

The present invention relates to an electron projection lithography apparatus using secondary electrons. More particularly, the present invention relates to an electron lithography apparatus using secondary electrons in which primary electrons are emitted using a cold emission technology for applying a voltage and emitting an electron at room temperature, the primary electrons are injected into an emitter, and secondary electrons are emitted at an exposed area from a patterned blocking mask formed on a surface of the emitter and projected onto a substrate.

2. Description of the Related Art

An electron projection lithography apparatus performs an exposure process by emitting electrons from an emitter and projecting the electrons onto an electron resist spaced apart from the emitter by a predetermined gap. The prior art discloses an electron projection lithography apparatus in which electrons are emitted by heating a pyroelectric emitter in a high vacuum state.

As a method of emitting electrons, a method of emitting secondary electrons by irradiating an emitter using an electron gun is known. When a rear side of a diamond substrate (an emitter) spaced apart from the electron gun by a predetermined gap in a vacuum chamber is irradiated using the electron gun, secondary electrons are emitted from a front side of the diamond substrate. In this case, a patterned mask is disposed on the front side of the diamond substrate, and an electron resist is placed at a predetermined distance from the front side of the diamond substrate. As such, the electron resist is patterned according to the mask pattern by the secondary electrons.

However, an electron gun is separately installed in a conventional electron projection lithography apparatus having the above structure, and thus, the lithography apparatus is inconveniently large. Also, the conventional electron projection lithography apparatus does not include a unit for forming a magnetic field, and thus, a resolving power is lowered when a pattern is projected onto a substrate with a scale of 1:1.

SUMMARY OF THE INVENTION

The present invention provides an electron projection lithography apparatus using secondary electrons having a compact structure in which primary electrons emitted by a field effect are incident on an emitter, and the secondary electrons are emitted from the emitter.

According to a feature of an embodiment of the present invention, there is provided an electron projection lithography apparatus using secondary electrons, the apparatus including a secondary electron emitter which is spaced apart from a substrate holder by a first predetermined interval and has a patterned mask formed on a surface thereof to face the substrate holder, a primary electron emitter which is spaced apart by a second predetermined interval from the secondary electron emitter in a direction opposite to the substrate holder and emits primary electrons to the secondary electron emitter, a second power supply which applies a second predetermined voltage between the substrate holder and the secondary electron emitter, a first power supply which applies a first predetermined voltage between the secondary electron emitter and the primary electron emitter, and a magnetic field generator which controls paths of secondary electrons emitted from the secondary electron emitter.

Preferably, the primary electron emitter is a plurality of micro-tips or carbon nanotubes to which the first predetermined voltage is applied from the first power supply and which emit the primary electrons toward the secondary electron emitter.

Preferably, a spacer is disposed between the primary electron emitter and the secondary electron emitter to maintain an interval therebetween.

The magnetic field generator may include permanent magnets or an electric magnet disposed below the first electron emitter and above the substrate holder. Alternatively, the magnetic field generator may be a DC magnetic field generator which surrounds sides of the secondary electron emitter and the substrate holder.

Meanwhile, preferably, the secondary electron emitter is a plate selected from the group consisting of a doped diamond single crystalline plate, a doped magnesium oxide plate, a doped AlN plate, and a doped AlGaN plate.

Preferably, the mask is formed of a material used to intercept electrons.

Preferably, a positive voltage is applied by the second power supply, a negative voltage is applied by the first power supply, and the secondary electron emitter is commonly grounded.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-64548, filed on Oct. 22, 2002, and entitled: "Electron Projection Lithography Apparatus Using Secondary Electrons" Is incorporated by reference herein in its entirety The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
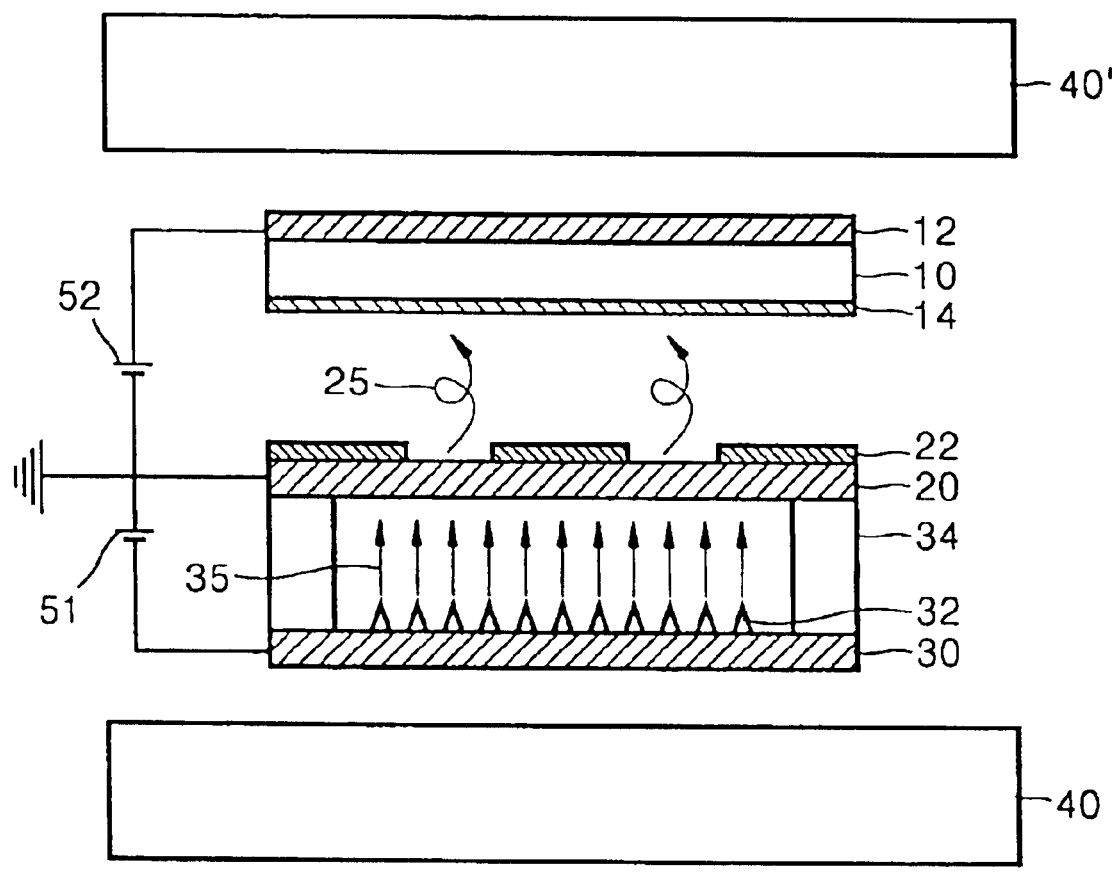
FIG. 1 schematically illustrates the structure of an electron projection lithography apparatus using secondary electrons according to a preferred embodiment of the present invention.

FIG. 1 schematically illustrates the structure of an electron projection lithography apparatus using secondary electrons according to a preferred embodiment of the present invention. Referring to FIG. 1, a substrate 10 coated with an electron resist 14 is disposed on a substrate holder 12. A secondary electron emitter 20 is spaced from the substrate 10 by a predetermined interval, and a patterned mask 22 is formed on a surface of the secondary electron emitter 20 to face the substrate holder 12. A primary electron emitter holder 30 is spaced a predetermined interval apart from the secondary electron emitter 20 in a direction opposite to the substrate holder 12. A primary electron emitter 32 is formed on the primary electron emitter holder 30 to face the secondary electron emitter 20. Primary electrons 35 emitted from the primary electron emitter 32 enter into the secondary electron emitter 20. A secondary power supply 52 applies a predetermined positive voltage between the substrate holder 12 and the secondary electron emitter 20, and a first power supply 51 applies a predetermined negative voltage between the secondary electron emitter 20 and the primary electron emitter holder 30. Also, permanent magnets 40 and 40' that control secondary electrons 25 emitted from the secondary electron emitter 20 to face the electron resist 14 are disposed outside the substrate holder 12 and the primary electron emitter holder 30 such that a magnetic field is formed parallel to an electric field.

The lithography apparatus has a compact structure in which the primary electron emitter holder 30 and the secondary electron emitter 20 are formed as a single body. The primary electrons 35 are emitted by a field effect when a predetermined voltage is applied to the primary electron emitter 32. In FIG. 1, a predetermined voltage, for example, a voltage of several kVs, is applied between the primary electron emitter holder 30 and the secondary electron emitter 20. A spacer 34 is disposed to maintain an interval of about 50–100 $\mu$m between the primary electron emitter holder 30 and the secondary electron emitter 20. Also, micro-tips such as molybdenum tips or carbon nanotubes are disposed in an array on the primary electron emitter holder 30 as the primary electron emitter 32.

In addition, the lithography apparatus operates in a high vacuum state, e.g., at a pressure of $2 \times 10^{-5}$ torr or less.

If a potential difference between the primary electron emitter holder 30 and the secondary electron emitter 20 is maintained at about 3–10 kV, electrons are emitted from the micro-tips of the primary electron emitter 32 and enter into the secondary electron emitter 20 via a vacuum area.

If a predetermined voltage, for example, a DC voltage of 20 kV, is applied between the secondary electron emitter 20 and the substrate holder 12, the substrate holder 12 functions as an anode, and the secondary electron emitter 20 functions as a cathode.

Preferably, a plate fabricated of doped diamond single crystal is used as the secondary electron emitter 20. Alternatively, a doped epitaxial growth diamond plate, a doped magnesium oxide plate, a doped AlN plate, or a doped AlGaN plate may be used as the secondary electron emitter 20. However, if a polycrystalline plate is used as the secondary electron emiter 20, electrons flow along a crystalline grain boundary, and thus electrons are not uniformly emitted.

The patterned mask 22 formed on the secondary electron emitter 20 serves to intercept electrons. The patterned mask 22 may be formed of a thin layer of Ti, Au, Pt, Ta, or Al having a thickness of about 500 Å, or a dielectric layer such as $SiO_2$ may be used as the patterned mask 22. Also, the patterned mask 22 may be formed by hydrogen processing so that secondary electrons are not emitted from the hydrogen-processed area, or by cesium (Cs) processing such that electron emission from the cesium-processed surface is enhanced, and thus, an electron beam emitted from the surface of the emitter has contrast between the cesium-processed area and other areas.

The secondary electron emitter 20 and the patterned mask 22 require good conductivity so that an electric field is uniformly distributed.

Meanwhile, a positive voltage is applied from the secondary power supply 52 between the substrate holder 12 and the secondary electron emitter 20 such that the secondary electrons 25 are emitted toward the substrate 10. Also, a negative voltage is applied from the first power supply 51 between the secondary electron emitter 20 and the primary electron emitter holder 30 such that the primary electrons 35 are emitted toward the secondary electron emitter 20. Thus, the secondary electron emitter 20 is commonly grounded.

Figure 2:
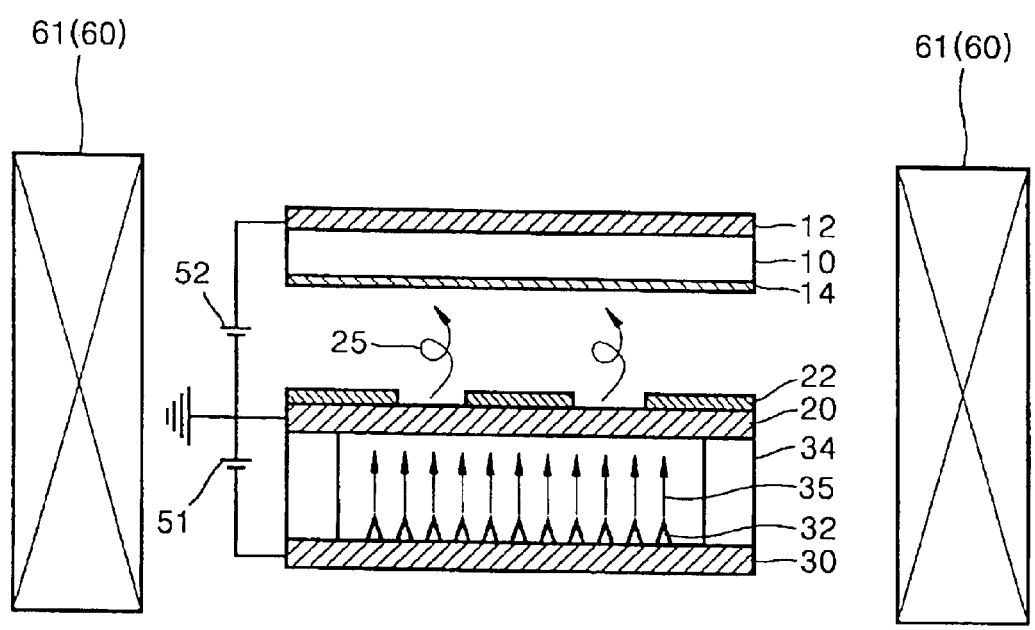
FIG. 2 schematically illustrates the structure of an electron projection lithography apparatus using secondary electrons according to a modified embodiment of the present invention.

Meanwhile, instead of each permanent magnet 40 or 40', an electric magnet may be used. Also, as illustrated in FIG. 2, a DC magnetic field generator 60 may be provided surrounding sides of the secondary electron emitter 20 and the substrate holder 12 such that an external magnetic field is generated parallel to an electric field. The DC magnetic field generator 60 may include a coil 61 and a DC supply (not shown) for supplying DC to the coil 61. Electron motion may be indicated by a vector component parallel to the electric field and a vector component perpendicular to the electric field.

Referring again to FIG. 1, when the external magnetic field is generated parallel to the electric field, electrons in the electric field and the magnetic field exhibit a spiral motion. That is, the electron motion vector component parallel to the electric field moves parallel to the electric field, and the electron motion vector component perpendicular to the electric field rotates. The combination of the parallel motion component and the rotational motion component causes the spiral motion exhibited by the electrons. The spiral motion is periodic and if the substrate 10 is disposed an interval from the secondary electron emitter 20 that becomes a multiple of the spiral motion period, a pattern on the secondary electron emitter 20 will be exactly projected with a scale of 1:1 onto the substrate 10. In general, the magnetic field and the interval between the secondary electron emitter 20 and the substrate 10 are fixed, and a voltage (electric field) is adjusted to achieve focus.

Hereinafter, operation of a lithography apparatus having a structure described above will be described in detail with reference to FIG. 1.

First, the substrate 10 coated with the electron resist 14 is disposed on the substrate holder 12, and the lithography apparatus is maintained in a high vacuum state, e.g., at a pressure of $2 \times 10^{-5}$ torr or less. Then, a voltage of −3 kV is applied by the first power supply 51 between the secondary electron emitter 20 and the primary electron emitter holder 30. Also, a voltage of 20 kV is applied by the secondary power supply 52 between the secondary electron emitter 20 and the substrate holder 12. The secondary electron emitter 20 is commonly grounded. Then, the primary electrons 35 are emitted from the micro-tips of the primary electron emitter 32. The emitted primary electrons 35 enter into the secondary electron emitter 20 and the secondary electrons 25 are emitted from the surface or the vicinity of the surface of the secondary electron emitter 20. The secondary electrons 25 are emitted from an area exposed by the patterned mask 22. The secondary electrons 25 make a spiral motion by a magnetic field formed by the permanent magnets 40 and 40', and the electron resist 14 on the substrate 10 is patterned by the secondary electrons 25. In this case, the substrate 10 is disposed at an interval which corresponds to a multiple of the spiral motion period of the secondary electrons 25, such that the pattern formed on the mask 22 is projected with a scale of 1:1 onto the substrate 10.

As described above, an electron lithography apparatus using secondary electrons according to the embodiments of the present invention has a compact structure even though it uses secondary electrons, and a resolving power is improved when a pattern is projected onto a substrate with a scale of 1:1.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An electron projection lithography apparatus using secondary electrons, the apparatus comprising:

a secondary electron emitter which is spaced apart from a substrate holder by a first predetermined interval and has a patterned mask formed on a surface thereof to face the substrate holder;

a primary electron emitter which is spaced apart by a second predetermined interval from the secondary electron emitter in a direction opposite to the substrate holder and emits primary electrons to the secondary electron emitter;

a second power supply which applies a second predetermined voltage between the substrate holder and the secondary electron emitter;

a first power supply which applies a first predetermined voltage between the secondary electron emitter and the primary electron emitter; and a magnetic field generator which controls paths of secondary electrons emitted from the secondary electron emitter.

2. The apparatus as claimed in claim 1, wherein the primary electron emitter is a plurality of micro-tips or carbon nanotubes to which the first predetermined voltage is applied from the first power supply and which emit the primary electrons toward the secondary electron emitter.

3. The apparatus as claimed in claim 2, wherein a spacer is disposed between the primary electron emitter and the secondary electron emitter to maintain an interval therebetween.

4. The apparatus as claimed in claim 1, wherein the magnetic field generator is comprised of permanent magnets or an electric magnet disposed below the first electron emitter and above the substrate holder.

5. The apparatus as claimed in claim 1, wherein the magnetic field generator is a DC magnetic field generator which surrounds sides of the secondary electron emitter and the substrate holder.

6. The apparatus as claimed in claim 1, wherein the secondary electron emitter is a plate selected from the group consisting of a doped diamond single crystalline plate, a doped magnesium oxide plate, a doped AlN plate, and a doped AlGaN plate.

7. The apparatus as claimed in claim 1, wherein the mask is formed of a material used to intercept electrons.

8. The apparatus as claimed in claim 1, wherein the mask is formed by hydrogen processing or cesium (Cs) processing.

9. The apparatus as claimed in claim 1, wherein a positive voltage is applied by the second power supply, a negative voltage is applied by the first power supply, and the secondary electron emitter is commonly grounded.

* * * * *